(12) United States Patent
Hamel et al.

(10) Patent No.: US 6,404,211 B2
(45) Date of Patent: *Jun. 11, 2002

(54) METAL BUCKLING BEAM PROBE

(75) Inventors: Harvey C. Hamel; Charles H. Perry, both of Poughkeepsie; Yuet-Ying Yu, Hopewell Junction, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,733

(22) Filed: Feb. 11, 1999

(51) Int. Cl.[7] ............................................. G01R 31/02
(52) U.S. Cl. ..................................... 324/754; 324/761
(58) Field of Search ................................ 324/754, 758, 324/760, 761, 72.5, 765; 439/482

(56) References Cited

U.S. PATENT DOCUMENTS

| | | | |
|---|---|---|---|
| 3,806,801 A | | 4/1974 | Bove |
| 3,975,680 A | * | 8/1976 | Webb .......................... 324/686 |
| 4,027,935 A | | 6/1977 | Byrnes et al. |
| 4,506,215 A | | 3/1985 | Coughlin |
| 4,622,514 A | * | 11/1986 | Lewis ......................... 324/761 |
| 4,843,315 A | | 6/1989 | Bayer et al. |
| 4,901,013 A | | 2/1990 | Benedetto et al. |
| 4,931,726 A | * | 6/1990 | Kasukabe et al. ........... 324/754 |
| 5,367,254 A | * | 11/1994 | Faure et al. ................. 324/761 |
| 5,804,984 A | * | 9/1998 | Alcoe et al. ................ 324/761 |
| 5,977,787 A | * | 11/1999 | Das et al. .................... 324/761 |

FOREIGN PATENT DOCUMENTS

WO      WO 97/43656      11/1997

* cited by examiner

*Primary Examiner*—Michael J. Sherry
*Assistant Examiner*—Minh Tang
(74) *Attorney, Agent, or Firm*—Ratner & Prestia; Tiffany L. Townsend, Esq.

(57) ABSTRACT

A buckling beam probe assembly and a process to make the assembly using insulated metal to hold the vertical beam probe wires. The buckling beam probe assembly electrically connects a test apparatus with contact pads on the surface of a device to be tested. The assembly is formed with a plurality of buckling beam wires each having a head, a body, and a tail. Each of the beam wires is pressed vertically onto the contact pads and buckles laterally to adapt to height differences of the contact pads caused by irregularities on the surface of the device to be tested. A top plate has a first plurality of apertures receiving the heads of the plurality of buckling beam wires. A bottom plate has a second plurality of apertures receiving the tails of the plurality of buckling beams wires. A plurality of intermediate metal sections are positioned between the top plate and the bottom plate. Each of the intermediate metal sections is formed with a plurality of thin metal layers and has a plurality of openings coated with an insulation layer. The bodies of the plurality of buckling beam wires pass through the openings.

32 Claims, 7 Drawing Sheets

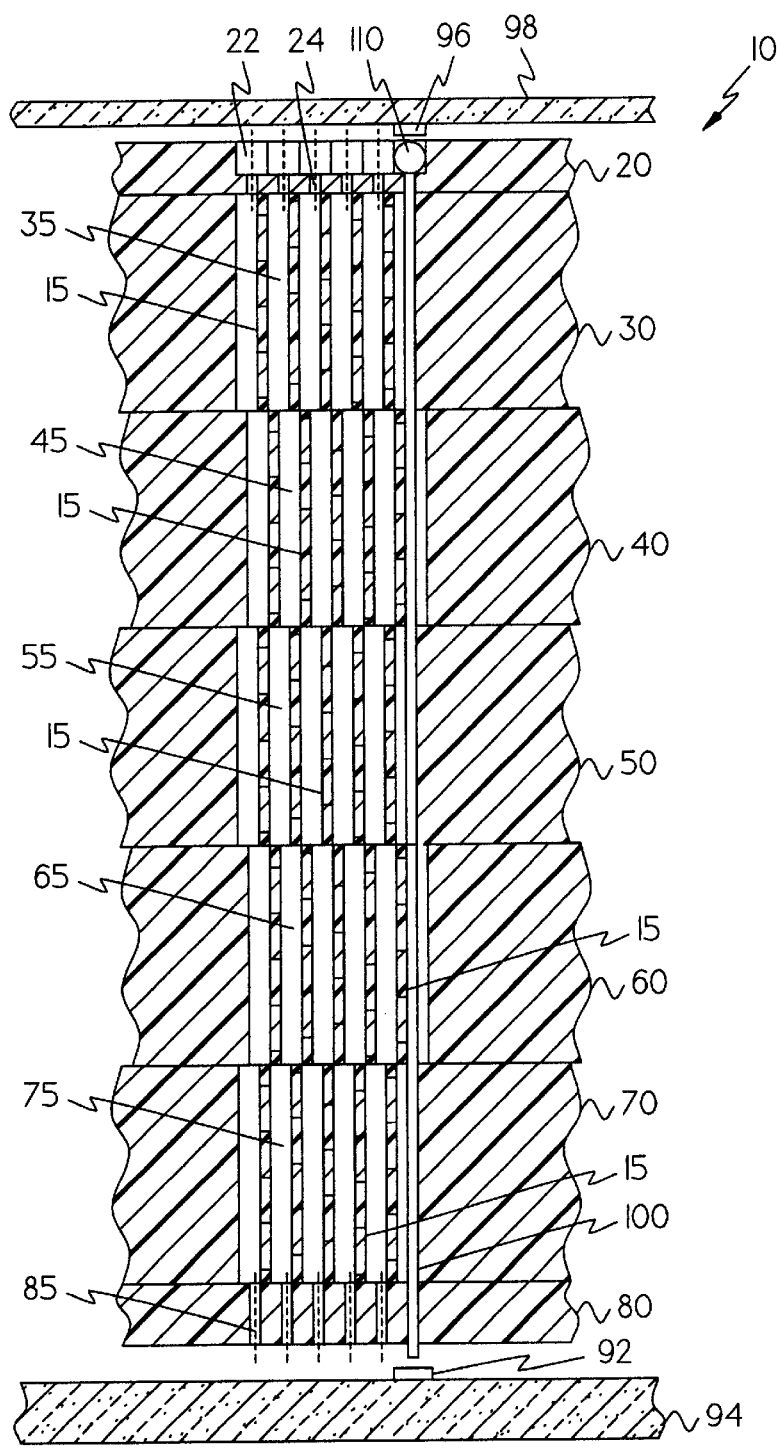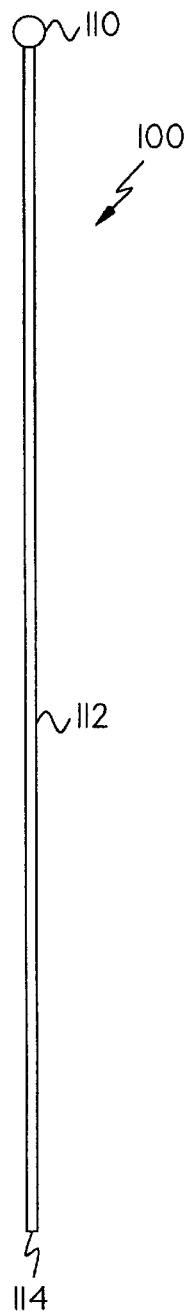
Fig. 1
Fig. 2

METAL BUCKLING BEAM PROBE

TECHNICAL FIELD

The present invention relates generally to the field of semiconductor wafer testing probe systems and, more specifically, to a buckling beam probe system and to a process for manufacturing the system using insulated metal to hold the probe wires.

BACKGROUND OF THE INVENTION

Small metal wires on the order of tens of microns (a few thousandths of an inch) in diameter are typically used to contact electrical test pads on individual die or to contact electrical test pads on portions of an entire semiconductor wafer. The configuration of the individual contact wires or probes depends on the layout of the test pads to be contacted. The test pads can be in a linear configuration, in an array, or in combinations. In most cases, the size of the test pads is on the order of 75 to 125 microns (three to five thousandths of an inch) in diameter and the center-to-center spacing from pad to pad can be as little as 85 microns (about three and one-half thousandths of an inch) for linear arrays and as little as 150 microns (six thousandths of an inch) for area arrays. The high density of electrical test pads on silicon die and wafers creates a challenge when attempting to contact the electrical test pads. Many different processes have been developed to meet that challenge.

One traditional process, directed to linear arrays, uses cantilever probes to contact the electrical test pads. These probes are small wires made from metal, having a high yield stress, such as beryllium copper or tungsten. The wires are formed in a long beam with a bend on one end that contacts the test pad. The other end of the wire is held by a card, usually made of polymer, that provides electrical interface to the test electronics and mechanical alignment and stability for the probe array. Typical industry examples are epoxy-ring and blade probe cards.

Area arrays present more of a challenge than linear arrays because the probe array must extend in a perpendicular direction away from the device under test (DUT) as opposed to a radial fan out direction for linear arrays. The density of an area array does not allow radial fan out of the probes. ("Fan out" means that the probes have a greater pitch at their tips than at their bases.) Accordingly, vertical conducting wires are used to contact area arrays. The vertical probes must be held in place to maintain mechanical alignment and to ensure that the probe tips contact the test pads for the DUT.

Typically, polymer or ceramic materials are chosen to hold all of the vertical probe wires. Cobra™ probes (available from International Business Machines Corporation of Armonk, N.Y.) and the buckling beam probes disclosed in U.S. Pat. No. 4,027,935 are both examples of vertical metal wire arrays held in place by polymer or ceramic materials. The probe wires can also be permanently bonded to a surface that is part of an electrical space transformer. The configuration of the bond pads on the space transformer is a mirror image of the configuration of the pads on the DUT. The probe wires are permanently bonded on the space transformer to form an array that will contact the array of pads on the DUT. In this case, the individual probe wires are held in place by a space transformer which functions as a three-dimensional fan out for the area array probes—thus bringing the high density of the probe array to a larger dimensional area array that is compatible with larger contact systems to interface with the test electronics. An industrial example of a bonded array probe is the system made by Formfactor, Inc. of Livermore, Calif. and disclosed in International Patent Application No. PCT/US97/08604.

The requirements for any probe system are electrical performance, mechanical and thermal stability, and manufacturability. Conventional Cobra™ and buckling beam probes have good manufacturability because they can be repaired. These probes have poor electrical performance, however, because electrical coupling exists between the individual probe wires.

In contrast, bonded probes have good electrical performance because the probe wires can be shorter than Cobra™ or buckling beam wires. But bonded probes have poor manufacturability: if one probe is damaged, it cannot be repaired. The entire system must be reworked because the probe system is integral with the space transformer.

The mechanical and thermal stability of either bonded probes or vertical wire probes can be adequate if the area of the probe array is not as large as an entire 200 mm (eight inch) wafer or greater. In this case, the thermal coefficient of expansion (TCE) becomes a major factor because many electrical tests are conducted at elevated temperatures. The space transformer holding the bonded probes or the materials holding the vertical wire probes must be matched to the TCE of the DUT which, in the case of silicon, is very low compared to most materials. Only certain ceramics and metals have a TCE matching silicon.

The requirements of probe systems for high-density chip and wafer testing must also be evaluated considering the future of device testing. The chip fabrication industry is moving in the direction of full wafer testing. This trend will require probe and space transformer systems that are suitable for large areas up to about 300 mm (twelve inches) in diameter. Although International Business Machines Corporation has developed and patented space transformers that satisfy this requirement, the present probe systems will not meet this requirement.

The buckling beam probe has been in use for over twenty years. It has high density and is both reliable and repairable. The probe has poor high-frequency characteristics, however, and is not suitable for large-area, elevated-temperature applications. One reason for these disadvantages is the polymer used to hold and guide the array of vertical probe wires. The dielectric properties of the polymer allow electrical coupling between the probe wires. The high inductance and AC coupling between adjacent probe wires render conventional probes suitable only for DC testing. This undesirable coupling is especially difficult because buckling beam wires are generally long to allow for buckling of the wires and permit compliance when contacting the DUT. The longer the probe wire, the worse the electrical coupling. In addition, the polymers used to hold the probe beams in place have a high TCE and are not thermally stable.

In view of the shortcomings of the prior art, it is an object of the present invention to provide a buckling beam probe system using insulated metal to hold the vertical beam probe wires. In this design, the desirable features of the buckling beam are preserved while correcting the deficiencies. The TCE of the metal can exactly match silicon (about 3 to $5 \times 10^{-6}$ per °C.). Because the material is metal, the beam probes cannot electrically couple. Another object of the present invention is to provide a buckling beam probe system in which the probe wires are not integral with the space transformer, thereby separating the probe system from the space transformer and facilitating repairs.

It is still another object of the present invention to provide a process for manufacturing a buckling beam probe system.

The process makes each beam wire a transmission line with controlled impedance. Controlled impedance allows the beams to be as long as necessary for compliance with no degradation in high-frequency (above 300 mHz) electrical performance. It is a further object of the present invention to provide a buckling beam probe that allows high density (less than a 0.2 mm or an 8 mil pitch), high electrical performance, low inductance, and high reliability; is repairable and mechanically, dimensionally, and thermally stable; and provides testing compatible and consistent with the present and future needs of the chip testing industry. Such needs include testing of larger area arrays up to 300 mm (twelve inches).

SUMMARY OF THE INVENTION

To achieve these and other objects, and in view of its purposes, the present invention provides a buckling beam probe assembly for electrically connecting a test apparatus with contact pads on the surface of a device to be tested. The assembly comprises a plurality of buckling beam wires each having a head, a body, and a tail and being pressed vertically onto the contact pads and buckling laterally to adapt to height differences of the contact pads caused by irregularities on the surface of the device to be tested. A top plate has a first plurality of apertures receiving the heads of the plurality of buckling beam wires. A bottom plate has a second plurality of apertures receiving the tails of the plurality of buckling beam wires. A plurality of intermediate metal sections are positioned between the top plate and the bottom plate. Each of the intermediate metal sections have a plurality of openings, the openings being coated with an insulation layer and receiving the bodies of the plurality of buckling beam wires.

The process for making the buckling beam probe assembly according to the present invention includes the steps of:

(a) providing a top plate having a first plurality of apertures and a bottom plate having a second plurality of apertures;

(b) forming a plurality of intermediate metal sections each having a plurality of openings coated with an insulation layer;

(c) stacking the bottom plate and the top plate with the plurality of intermediate metal sections between the bottom plate and the top plate;

(d) loading a plurality of buckling beam wires into the apertures of the top and bottom plates and into the openings in each of the plurality of intermediate metal sections;

(e) shifting at least one of the plurality of intermediate metal sections with respect to the others of the plurality of intermediate metal sections; and (f) applying fasteners holding in position the stack of bottom plate, shifted plurality of intermediate metal sections, and top plate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 is a cross section of a buckling beam probe assembly according to a first exemplary embodiment of the present invention;

FIG. 2 illustrates the buckling beam wire used in combination with the buckling beam probe assembly shown in FIG. 1;

DETAILED DESCRIPTION OF THE INVENTION

Figure 3:
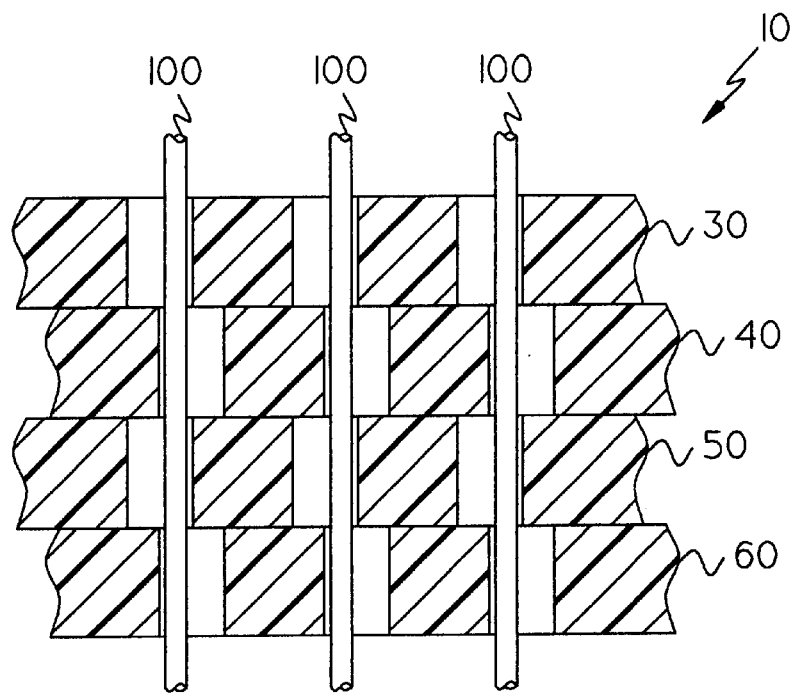
FIG. 3 is a partial sectional view of a buckling beam probe assembly according to the first exemplary embodiment of FIG. 1 with the buckling beam wires in a straight position.

Referring now to the drawing, wherein like reference numerals refer to like steps and elements throughout, FIG. 1 is a sectional view of a buckling beam probe assembly 10 according to a first exemplary embodiment of the present invention. FIG. 1 shows buckling beam wire 100 positioned inside assembly 10 in the unbuckled or straight configuration. FIG. 2 illustrates buckling beam wire 100 positioned outside assembly 10, also in the unbuckled or straight configuration. Buckling beam wire 100 has a head 110, typically a swaged head; a tail 114; and a long beam or body 112.

FIG. 1 also shows buckling beam probe assembly 10 having a top plate 20; sections 30, 40, 50, 60, and 70; and a bottom plate 80. Top plate 20 has apertures 22 and 24. Bottom plate 80 has apertures 85. Larger aperture 22 receives head 110 and smaller aperture 24 receives body 112 of buckling beam wire 100 when buckling beam wire 100 is inserted into buckling beam probe assembly 10. Similarly, aperture 85 receives tail 114 of buckling beam wire 100 when buckling beam wire 100 is inserted into buckling beam probe assembly 10.

Sections 30, 40, 50, 60, and 70 are identical in shape, size, and thickness. Each of sections 30, 40, 50, 60, and 70 has the same number of layers 15 producing the thickness of each section. Also, each of sections 30, 40, 50, 60, and 70 has the same shape and size of openings 35, 45, 55, 65, and 75, respectively. Each of sections 30, 40, 50, 60, and 70 is made using thin layers 15 and is provided with openings 35–75 to accommodate buckling beam wire 100. The number of sections 30, 40, 50, 60, and 70 can be varied according to design specifications to accommodate a longer or a shorter buckling beam wire 100. Thus, the five sections 30, 40, 50, 60, and 70 are but one example; fewer or more sections are within the scope of the present invention.

When buckling beam probe assembly 10 is not under any testing conditions, the buckling beam wire 100 is straight, as shown in FIGS. 1 and 2. During wafer testing, buckling beam probe assembly 10 provides electrical connection between the test pads 92 on the DUT 94 and the pads 96 on the space transformer 98. The buckling beam wires 100 are not integral with the space transformer 98, rather they are loosely connected, thereby separating the probe system from the space transformer and facilitating repairs.

The pads 96 on the space transformer 98 are a mirror image of the configuration of the test pads 92 on the DUT 94. Thus, each individual buckling beam wire 100 conducts from each test pad 92 on the DUT 94 to the corresponding pad 96 on the space transformer 98. As shown in FIG. 1, the buckling beam wire 100 is slightly longer than the total, combined length of top plate 20; sections 30, 40, 50, 60, and 70; and bottom plate 80 of buckling beam probe assembly 10. This extra length causes the buckling beam wire 100 to extend slightly above top plate 20 and below bottom plate 80. Buckling beam wire 100 is typically made of beryllium copper, tungsten, or alloys containing platinum or palladium.

Figure 4:
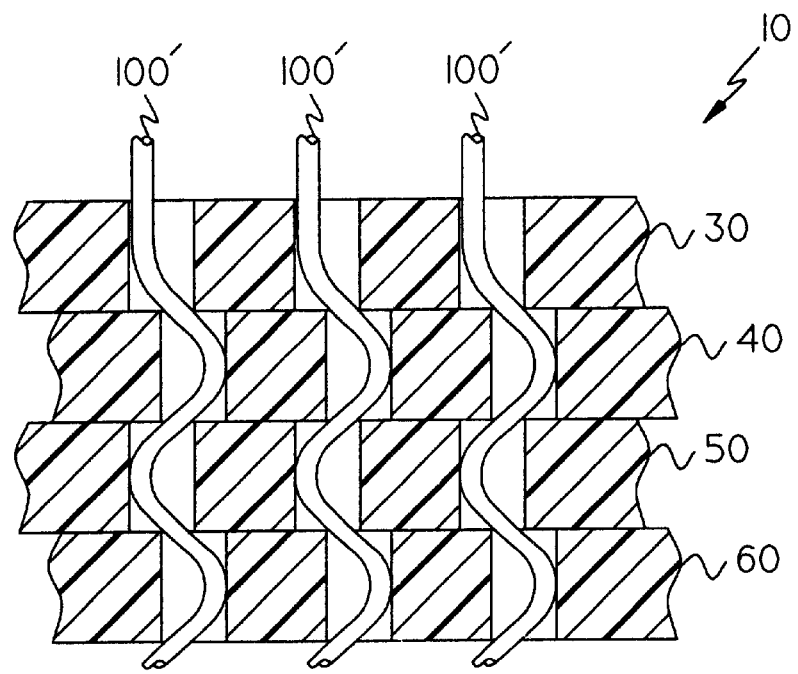
FIG. 4 is a partial sectional view of a buckling beam probe assembly according to the first exemplary embodiment of FIG. 1 with the buckling beam wires in the buckled state.

In operation, bottom plate 80 is placed against the DUT 94 and top plate 20 is placed against the space transformer 98. The DUT 94, the space transformer 98, and buckling beam probe assembly 10 are properly aligned and cause each buckling beam wire 100 in the array to contact the correct pads 92, 96 on the DUT 94 and space transformer 98. The extra length of the buckling beam wires 100 causes each wire to come under vertical load between the DUT 94 and space transformer 98. Typically, the load is between 10 to 25 grams per buckling beam wire 100. This load causes each buckling beam wire 100 to buckle (as buckled, the buckling beam wires are designated by the reference number 100') as shown in FIG. 4. The buckling of buckling beam wires 100 provides a spring-loading action between the pads 92 on the DUT 94 and the pads 96 on the space transformer 98. This action allows for compensation of small planarity differences between the DUT 94 and space transformer 98.

FIGS. 3 and 4 show a portion of a buckling beam probe assembly 10 illustrating only sections 30, 40, 50, and 60 of FIG. 1. FIG. 3 illustrates three buckling beam wires 100 in their straight position in buckling beam probe assembly 10 when the assembly is not under testing conditions. FIG. 4 illustrates buckling beam wires 100' in a buckled state in buckling beam probe assembly 10 when the probe is under testing conditions. The buckled state of buckling beam wires 100' shown in FIG. 4 is for illustration purposes only and in no way limits the way in which buckling beam wires 100 buckle. Rather, the nature and direction of buckling of buckling beam wires 100 will vary as a function of a number of factors, including the shape and size of openings 35, 45, 55, 65, and 75.

Figure 5:
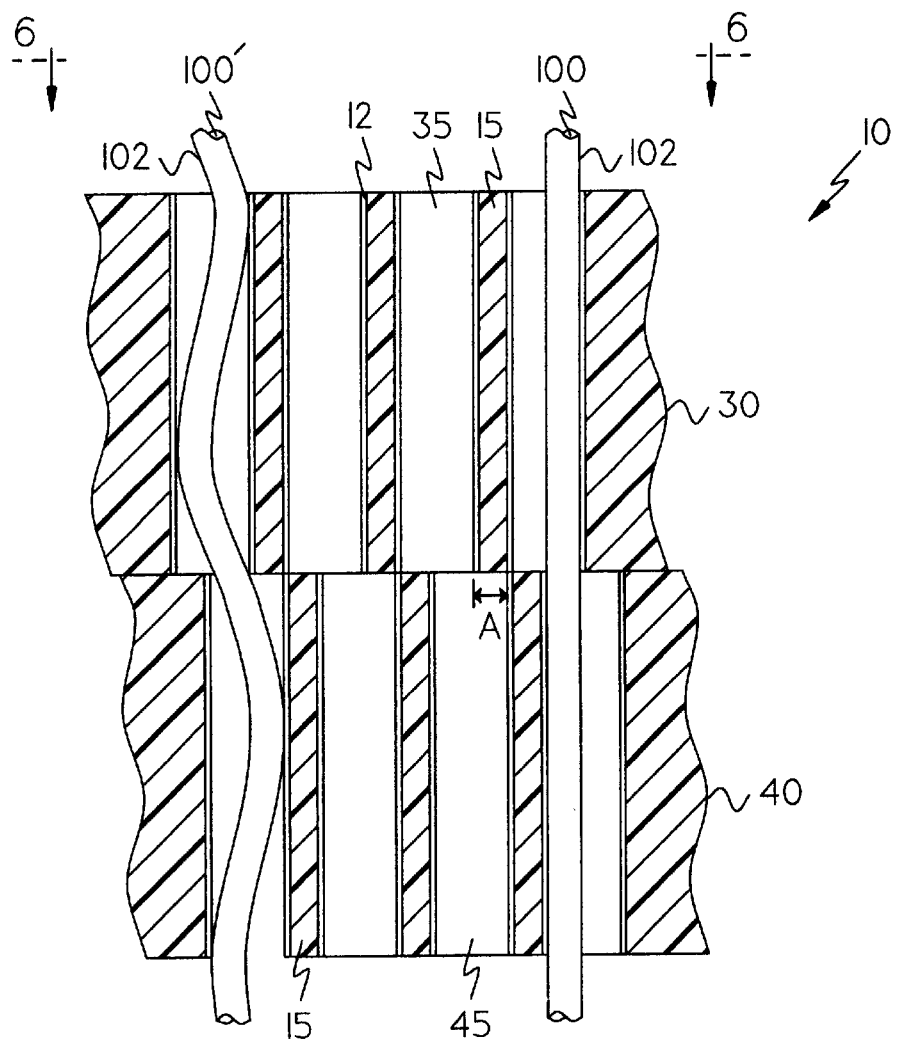
FIG. 5 is a partial sectional view of a buckling beam probe assembly according to a second exemplary embodiment of the present invention.

FIG. 5 is a partial sectional view of the buckling beam probe assembly 10 according to a second exemplary embodiment of the present invention. FIG. 5 shows sections 30 and 40 similar to any two sections of buckling beam probe assembly 10 of FIG. 1. The only differences between the embodiment of FIG. 5 and the embodiment of FIG. 1 are that the identical openings (e.g., 35 and 45) each have an added insulation layer 12 and the buckling beam wires 10, 10' each have an added insulation coating 102. Such insulation prevents short circuits.

Although both openings and buckling beam wires are illustrated with insulation in FIG. 5, insulation on both features of buckling beam probe assembly 10 is usually unnecessary. In practical application, therefore, insulation layer 12 will be provided on openings 35, 45, 55, 65, and 75 or, alternatively, insulation coating 102 will be provided on buckling beam wires 10, 10'. Insulation layer 12 may also be provided on apertures 22 and 24 of top plate 20 and on apertures 85 of bottom plate 80.

Figure 6:
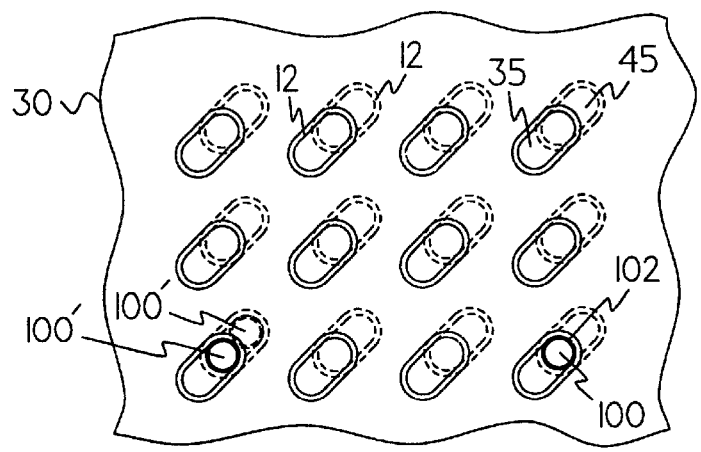
FIG. 6 is a top view of a section of the buckling beam probe assembly shown in FIG. 5.

FIG. 6 is a top view of section 30 of FIG. 5. FIG. 6 illustrates the shape of openings 35 and 45, insulation layer 12, insulation coating 102, and buckling beam wires 100 and 100'. The bottom view of section 40 of FIG. 5 would be similar to the view shown in FIG. 6. FIG. 6 also shows the position of openings 35 and 45 relative to each other. As shown in FIG. 6, openings 35, 45 have oval shapes giving space for buckling beam wires 100 to buckle into buckling beam wires 100' as shown in FIGS. 5 and 4.

Figure 7A:
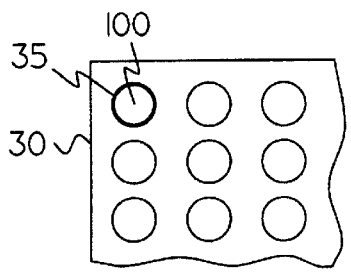
FIGS. 7A, 7B, 7C, 7D, 7E, 7F, and 7G are top or bottom views of some of the different shapes of openings suitable for the buckling beam probe assembly of the present invention.
Figure 7B:
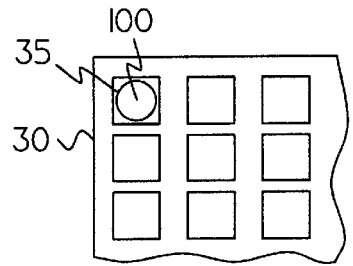
Figure 7C:
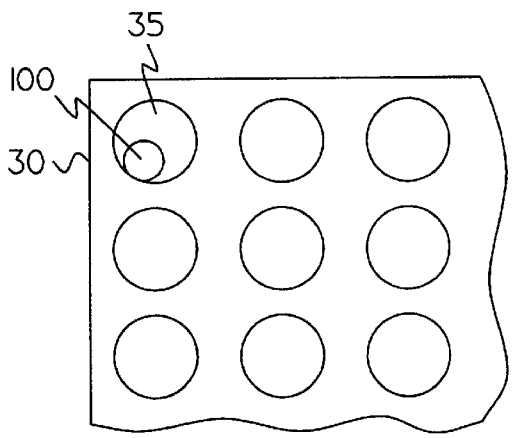
Figure 7D:
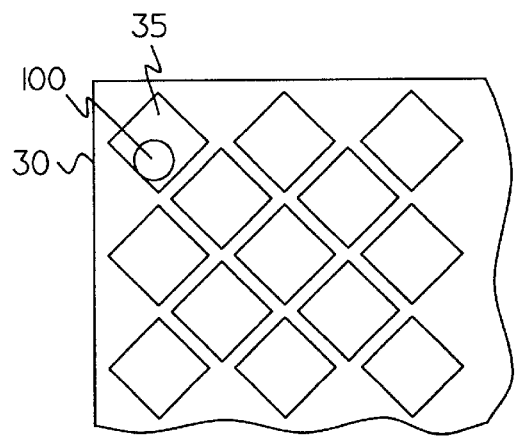
Figure 7E:
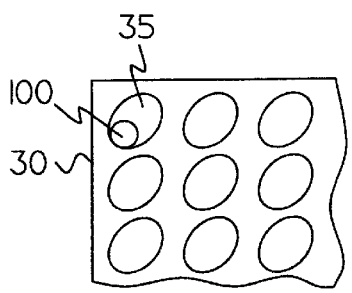
Figure 7F:
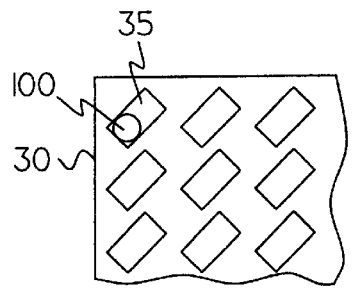
Figure 7G:
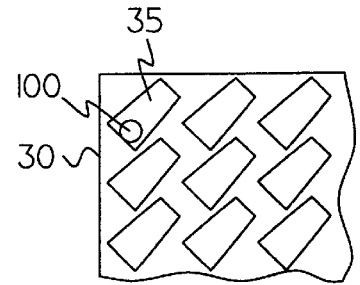

Openings 35, 45, 55, 65, and 75 of FIG. 1 can have any geometric shape, however, including circular, square, rectangular, or any other shape according to design specifications and parameters. As examples, using section 30 and its openings 35 for purposes of illustration, FIGS. 7A (circular), 7B (square), 7C (large circular), 7D (diamond), 7E (oval), 7F (rectangular), and 7G (trapezoidal) show a top or bottom view illustrating a variety of different shapes possible for the openings 35, 45, 55, 65, and 75 in sections 30, 40, 50, 60, and 70, respectively, shown in FIG. 1. Openings 35, 45, 55, 65, and 75 can also be of any size needed to satisfy particular design specifications. Advantageously, some of the metal layers 15 in a particular component can have oval-shaped openings, to allow buckling beam wire 100 to buckle under load, while the openings of other metal layers of that same component can have different shapes to adjust the air gap around the buckling beam wire 100 for impedance control.

Figure 8:
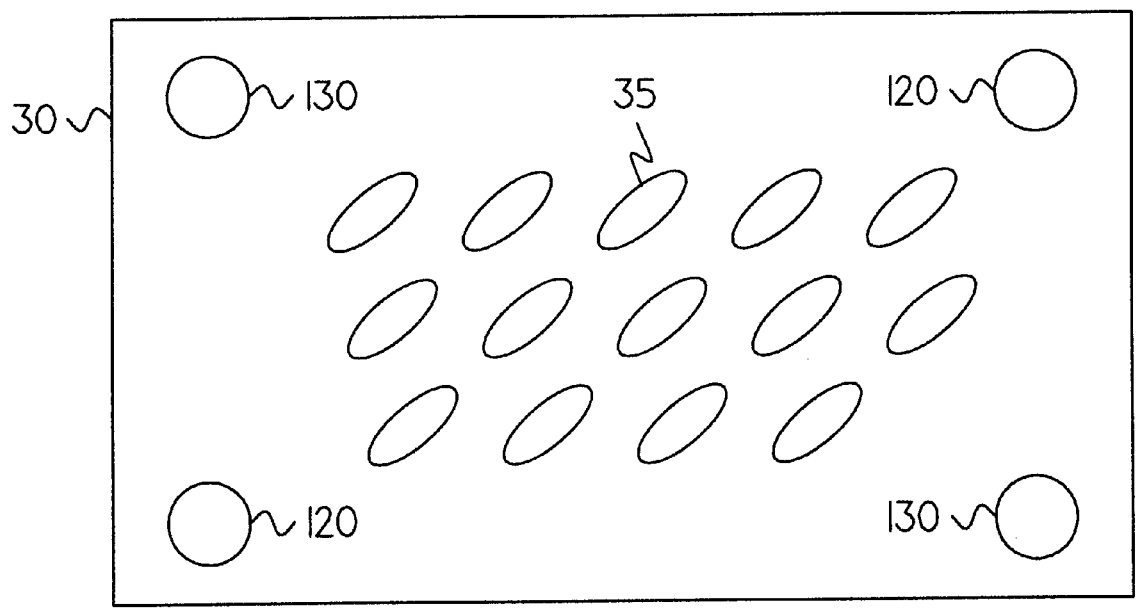
FIG. 8 is a top or bottom view of any of the plates or sections of the buckling beam probe assembly of the present invention illustrating the alignment holes.

FIG. 8 shows a top or a bottom view of one of sections 30, 40, 50, 60, or 70; or of top plate 20; or of bottom plate 80 of the buckling beam probe assembly 10 shown in FIG. 1. Section 30 is used for purposes of illustration. FIG. 8 illustrates alignment holes 120 and 130 in addition to the openings 35 which accept buckling beam wires 100. As shown in FIG. 8, alignment holes 120 and 130 are circular but they can have any suitable shape and size. Sections 40, 50, 60, and 70 and top plate 20 and bottom plate 80 each have similar alignment holes 120 and 130.

Assembly of the buckling beam probe assembly 10 involves loading all the sections 30, 40, 50, 60, and 70 and top plate 20 and bottom plate 80 in the stack shown in FIG. 1. Top plate 20, bottom plate 80, and all sections 30, 40, 50, 60, and 70 have two sets of alignment holes 120 and 130. To assemble sections 30–70 and plates 20, 80 of buckling beam probe assembly 10, dowel pins can be inserted into alignment holes 120 before loading the buckling beam wires 100. Alignment holes 120 are arranged in each component of the stack to cause apertures 22 and 24; openings 35, 45, 55, 65, and 75; and apertures 85 to be in alignment. This arrangement facilitates loading the buckling beam wires 100.

After all buckling beam wires 100 are inserted into the buckling beam probe assembly 10, the dowel pins are removed and the sections 30, 40, 50, 60, and 70 are then shifted relative to each other. As shown in FIGS. 1, 4, and 5, the section shifts are necessary to allow the buckling beam wires 100 to buckle under load in a preferred direction. For example, shift between sections 30 and 40 is represented by arrow "A" as illustrated in FIG. 5. After the sections are shifted, dowel pins are inserted into the second set of alignment holes 130 to maintain the sections 30, 40, 50, 60, and 70 in their proper position. The entire buckling beam probe assembly 10 is then held together by fasteners such as screws through the length of the assembly.

In a typical buckling beam probe assembly, each section 30, 40, 50, 60, and 70 is made of an organic material such as polytetrafluoroethylene (available under the trademark Teflon from E.I. DuPont deNemours & Co., Inc. of Wilmington, Del.), FR4, polyimide, and the like. The openings 35, 45, 55, 65, and 75 for buckling beam wires 100, the alignment holes 120 and 130 for the dowel pins, and any additional orifices (if required) for the fasteners are drilled or machined into each section. The same is true for the apertures 22, 24, and 85 of top plate 20 and bottom plate 80. Because the top plate 20 and the bottom plate 80 determine the alignment of buckling beam wires 100 to the DUT 94 and space transformer 98, they must be drilled to a tight tolerance: usually less than about ±10 microns (±0.5 thousandths of an inch). Openings 35, 45, 55, 65, and 75 in sections 30, 40, 50, 60, and 70 need not have as tight a tolerance; these openings should have a tolerance of at least ±25 microns (±1.0 thousandths of an inch) or less. Although the thickness of individual sections 30, 40, 50, 60, and 70 can be varied according to the application, 2.5 to 5 mm (0.100 to 0.200 inches) is typical.

The materials used for, and the processes used to manufacture, the components of conventional buckling beam probe assemblies impair certain characteristics of such assemblies. In addition, conventional materials and processes often limit design options. Sections 30–70 may be too thick, for example, to be drilled or machined.

To improve the electrical performance, TCE match, and probe positional accuracy for large area applications, according to the present invention the buckling beam top plate 20, bottom plate 80, and sections 30–70 are each made of layers 15 of metal. Preferably, layers 15 are a steel alloy containing about 36% nickel, commercially available under the trademark Invar from Creusot-Loire, because the TCE of the Invar alloy matches silicon and can be photo etched. Metals such as molybdenum, stainless steel, iron, and nickel, or iron-nickel alloys, can also be used depending on the desired TCE. Other metals can also be incorporated in the alloys such as chromium and copper.

Top plate 20 and bottom plate 80 can be made thinner than sections 30–70 and could be drilled or machined in some fashion—but this is not the preferred process. Rather, each of these components are manufactured, according to the present invention, using a process that incorporates thin metal layers 15 which are approximately 50 to 500 microns (0.002 to 0.020 inches) thick. Such metal layers 15 can be photo etched with high precision to very tight tolerances in the range of ±2.5 microns (±0.0001 inches). Therefore, for example, if it is desired to make a section 2.5 mm (0.100 inches) thick, twenty-five metal layers 15 which are 100 microns (0.004 inches) thick would be used. Such etching allows precision location of the apertures, holes, and openings and higher density than can be achieved by drilling or machining a polymer component. In addition, each component can have its apertures, holes, and openings etched differently from those of the components above or below it.

Any other thickness from 50 microns up to 2.5 mm (0.002 up to 0.100 inches) or thicker could be used. The process used to form the openings, holes, and apertures depends to some extent, however, on the thickness of the metal layers 15. For chemical etching, the standard procedure is to have a one-to-one ratio for layer thickness to opening or aperture diameter. It is difficult to etch a 100 micron (0.004 inch) diameter hole, for example, in a metal layer 200 microns (0.008 inches) thick. This example corresponds to a thickness-to-diameter ratio of two and, although possible, is not desirable. Other processes like electro discharge machining (EDM) could also be used to form the openings, holes, and apertures in thicker or thinner metal layers. Chemical etching is the preferred process, however, economically and for the best dimensional control. Each layer 15 has the identical etched array of openings 35 in section 30, openings 45 in section 40, openings 55 in section 50, openings 65 in section 60, and openings 75 in section 70 for buckling beam wires 100; alignment holes 120, 130; and fastener orifices (if any).

Figure 9:
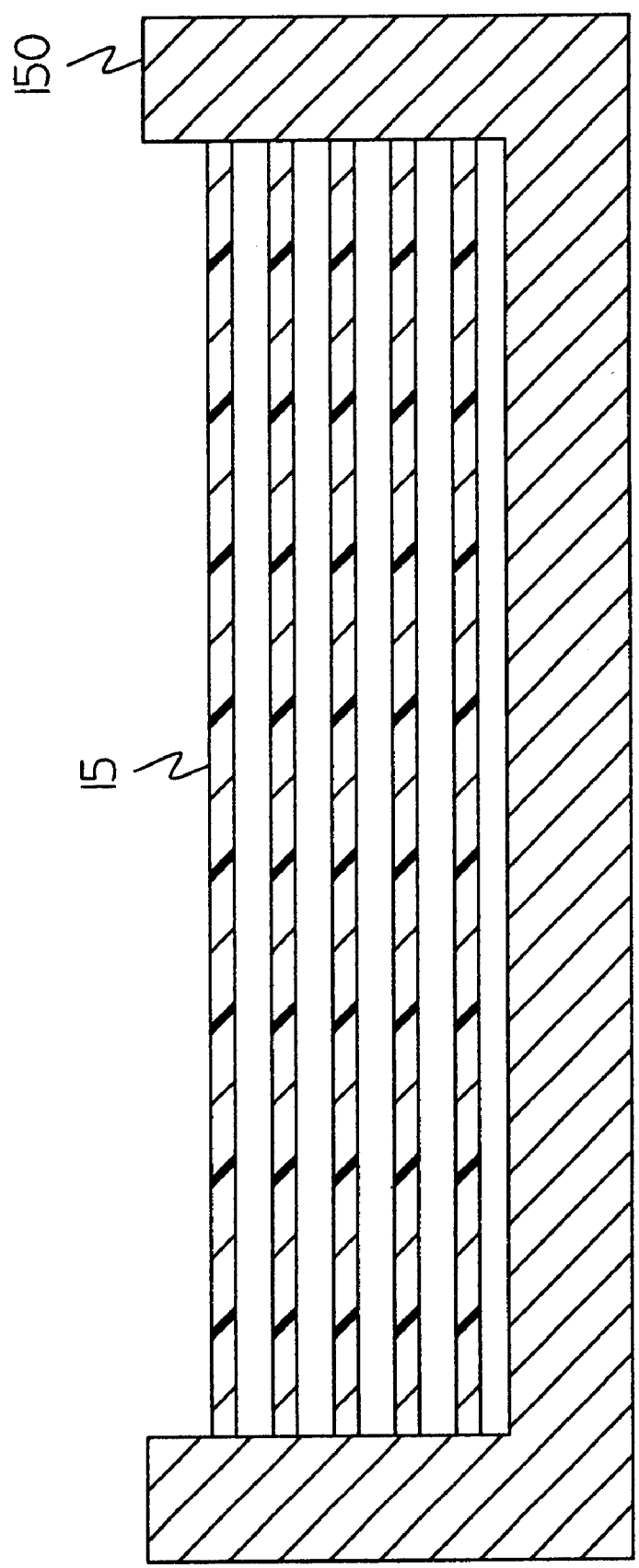
FIG. 9 is a sectional view of a fixture with the metal layers used to form the plates and sections of the buckling beam probe assembly of the present invention in position.

After etching the required openings, holes, and apertures in each layer 15, each layer 15 is then coated with a thin layer of a conductor such as gold. Layers 15 are stacked, for example, in a fixture 150 as shown in FIG. 9. Layers 15 could also be held in alignment during lamination and fusing in a cavity die. Other mechanisms such as dowel pins or spring-loaded dowel pins could also be used. The design of the cavity die or the shape and location of the dowel pins can vary as desired.

Uniform pressure is applied to layers 15 in fixture 150, thus forcing each layer 15 into intimate contact. At a uniform pressure in the range between 1,000 to 50,000 psi (preferably 15,000 psi) and a temperature range of 200 to 300° C., a gold-gold diffusion bond takes place between each layer 15 thus fusing the layers 15 into one integral component (i.e., section 30, 40, 50, 60, 70; top plate 20; or bottom plate 80). The resultant component has the required thickness and has all of the openings, holes, and apertures in precise locations similar to the conventional, organic counterpart formed using drilling or machining operations.

Various metals other than gold can also be used to coat and bond layers 15. Such metals include lead-tin solder of various compositions, silver, and copper—all either plated or evaporated. The thickness of the bonding metal can be from 500 Angstroms up to a few microns. Polymers could also be used such as polyimides, silicones, urethanes, and the like. Conductive polymers could also be used.

Another process for bonding layers 15 is to bolt layers 15 together and allow parylene (see below) to bond the buckling beam probe assembly 10 together. Openings, holes, and apertures would be etched in each layer 15 and filled with adhesive before or during lamination. The adhesive would cure and hold the layers 15 together similar to a bolt through the individual layers 15.

The final step in fabricating a functional section or plate for the buckling beam probe assembly 10 is coating the laminated and fused metal section or plate with an insulating polymer film. This step can be accomplished, for example, by using parylene. Parylene is the generic name for members of a unique polymer series.

The basic member of the series, called Parylene N, is poly-para-xytylene, a completely linear, highly crystalline material. Parylene C, the second commercially available member of the series, is produced from the same monomer modified only by the substitution of a chlorine atom for one of the aromatic hydrogens. Parylene D, the third member of the series, is produced from the same monomer modified by the substitution of a chlorine atom for two of the aromatic hydrogens. Parylene D is similar in properties to Parylene C with the added ability to withstand higher use temperatures.

Parylene N is a primary dielectric, exhibiting a very low dissipation factor, high dielectric strength, and a dielectric constant invariant with frequency. This form has the highest penetrating power of all the parylenes. Parylene C has a useful combination of electrical and physical properties plus a very low permeability to moisture and corrosive gases. Along with its ability to provide a true pinhole-free conformal insulation, Parylene C is the material of choice for coating critical electronic assemblies. Due to the uniqueness of the vapor phase deposition, the parylene polymers can be formed as structurally continuous films from as thin as a fraction of a micrometer to as thick as several mils.

The parylene polymers are deposited from the vapor phase by a process which in some respects resembles vacuum metallizing. Unlike vacuum metallization, however, which is conducted at pressures of 10 torr or below, the parylenes are formed at around 0.1 torr. Under these conditions, the mean free path of the gas molecules in the deposition chamber is on the order of 0.1 cm. Therefore, unlike vacuum metallizing, the deposition is not line of sight, and all sides of an object to be encapsulated are uniformly impinged by the gaseous monomer. This advantage is responsible for the truly conformal nature of the coating.

Thus, parylene can be vapor deposited and can penetrate into the small openings and apertures of the components of the buckling beam probe assembly 10 and deposit a uniform coating. Parylene is similar to the Teflon polymer. It has good wear characteristics and a low coefficient of friction.

Parylene is preferably used as the insulation layer 12 illustrated in FIGS. 5 and 6. Other materials that are vapor deposited, such as ceramics or other polymers, could be used. Dipping might be possible using a very low viscosity fluid. Metal oxidation could also be used to insulate the surface of the metal. The step of coating layers 15 before lamination with another metal that is later oxidized could be done. Metal layers 15 could also be coated with an insulating polymer and then laminated. The polymer functions to insulate apertures 22, 24, and 85 and openings 35, 45, 55, 65, and 75 and to laminate layers 15 together.

Figure 10:
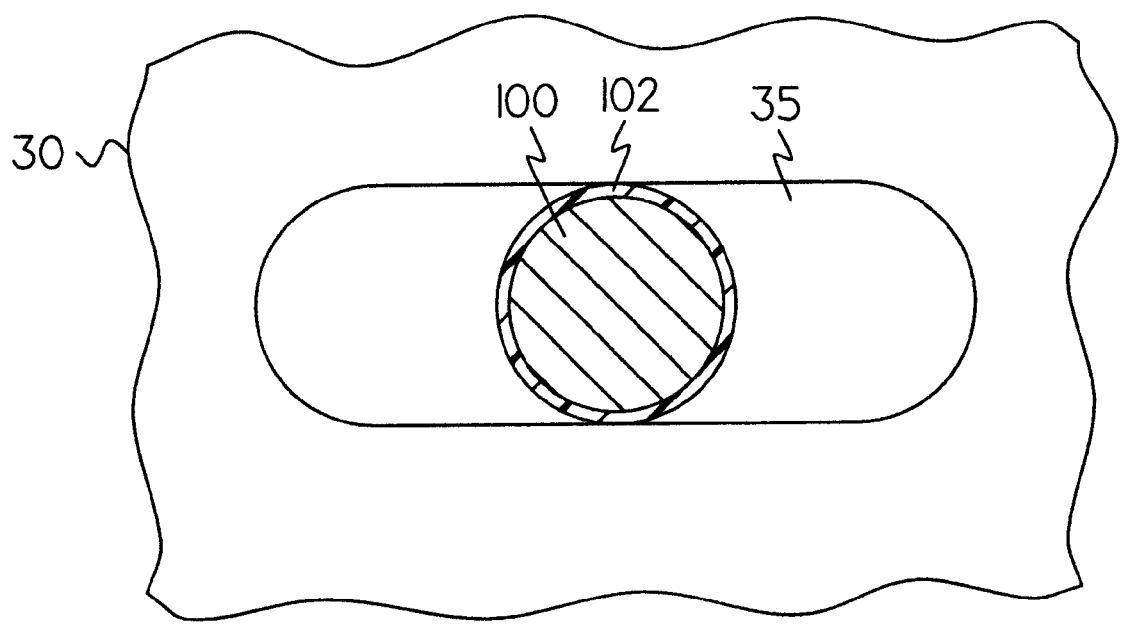
FIG. 10 is a cross-sectional view of an insulated buckling beam wire positioned within an opening in one of the sections of the buckling beam probe assembly of the present invention.

Insulation coating 102 applied to buckling beam wire 100 is also an insulating polymer such as polyimide. FIG. 10 shows buckling beam wire 100 having an insulation coating 102 in opening 35 of section 30. The electrical environment of each buckling beam wire 100 can be tailored. The insulated buckling beam wire 100 in insulated apertures 22, 24, 85 and openings 35, 45, 55, 65, and 75 thus forms a transmission line.

Typical dimensions for an exemplary buckling beam probe assembly 10 manufactured in accordance with the present invention are provided for illustration purposes. Larger apertures 22 in top plate 20 may have a diameter of about 0.2 mm (0.0078 inches) and a depth of about 0.25 mm (0.010 inches). Smaller apertures 24 in top plate 20 and apertures 85 in bottom plate 85 may all have a diameter of about 0.08 mm (0.0032 inches). Assuming oval openings 35, 45, 55, 65, and 75 in sections 30, 40, 50, 60, and 70, respectively, such openings may have a long axis of about 0.18 mm (0.007 inches) and a short axis of about 0.1 mm (0.004 inches). The parylene insulation layer 12 in the openings 35, 45, 55, 65, and 75 may be about 0.01 mm (0.0005 inches) thick.

Each section 30, 40, 50, 60, and 70 may be about 3 mm (0.116 inches) tall. Top plate 20 and bottom plate 80 may each be about 0.51 mm (0.020 inches) tall. Thus, the complete height of exemplary buckling beam probe assembly 10 may be about 15.75 mm (0.620 inches). Buckling beam wire 100 may be about 15.9 mm (0.627 inches) tall with a diameter of about 35 to 100 microns (0.0014 to 0.004 inches) and, more specifically, of about 0.064 mm (0.0025 inches). Thus, buckling beam wire 100 may extend 0.18 mm (0.007 inches) beyond the height of exemplary buckling beam probe assembly 10. The polyimide insulation coating 102 on buckling beam wire 100 may be about 2 to 5 microns and, more specifically, about 0.005 mm (0.0002 inches) thick.

The dimensions provided above yield a characteristic impedance of 30 ohms which will allow a 2 gHz bandwidth for the buckling beam probe assembly 10. The impedance of the metal buckling beam probe assembly 10 can be adjusted by modifying the size and shape of openings 35, 45, 55, 65, and 75. This relationship is an inherent advantage of the present invention because the openings 35–75 are photo etched allowing any geometry.

The top plate 20, bottom plate 80, and sections 30, 40, 50, 60, and 70 are all manufactured using thin, photo etched metal layers 15 that are gold coated and laminated at elevated temperature to form components of the metal buckling beam probe assembly 10. After lamination, each component is coated with parylene. The components are stacked and the buckling beam wires 100 are loaded in the conventional manner. The sections 30, 40, 50, 60, and 70 are shifted and, after the fasteners are positioned, buckling beam probe assembly 10 is ready for use. The mechanical operation of buckling beam probe assembly 10, manufactured according to the present invention, is identical to the conventional, organic counterparts in all respects. The manufacturing process allows superior electrical performance and expansion to larger area arrays up to 300 mm (twelve inches) because the metal of the buckling beam probe assembly 10 has a low TCE and the openings, holes, and apertures are etched with high positional accuracy over a large area.

Thus, a buckling beam probe assembly 10 is described that incorporates insulated metal components to hold and guide the individual buckling beam wires 100. Dimensionally, the metal components are similar to the conventional polymer or plastic components previously used for those functions. The use of metal components creates a coaxial conducting path for each buckling beam wire 100, allowing impedance control by design. The insulated metal components also prevent electrical coupling between adjacent buckling beam wires 100. The combination of the coaxial design with the elimination of inductive and capacitive coupling provides high alternating current bandwith.

Although illustrated and described above with reference to certain specific embodiments, the present invention is nevertheless not intended to be limited to the details shown. Rather, various modifications may be made in the details within the scope and range of equivalents of the claims and departing from the true spirit and scope of the invention.

What is claimed:

1. A process for making a buckling beam probe assembly adapted to electrically connect a test apparatus, comprising the steps of:
   (a) providing a top plate having a first plurality of apertures and a bottom plate having a second plurality of apertures;
   (b) forming a plurality of intermediate metal sections each comprising multiple thin metal layers, each intermediate metal section having a plurality of openings coated with an insulation layer;
   (c) stacking the intermediate metal sections on top of each other and on top of said bottom plate, and stacking the top plate on top of the stacked plurality of intermediate metal section;

(d) loading a plurality of buckling beam wires into the apertures of the top and bottom plates and into the openings in each of the plurality of intermediate metal sections;

(e) shifting at least one of the plurality of intermediate metal sections with respect to the others of the plurality of intermediate metal sections; and (f) applying fasteners holding in position the stack of bottom plate, shifted plurality of intermediate metal sections, and top plate.

2. The process of claim 1 wherein the step of forming each of the plurality of intermediate metal sections includes:

(b1) providing said multiple thin metal layers;

(b2) etching the plurality of openings in each of the metal layers;

(b3) coating each metal layer with a conductor;

(b4) stacking the metal layers;

(b5) bonding the metal layers to form an integral intermediate metal section; and (b6) coating the bonded metal layers with an insulation layer.

3. The process of claim 2 wherein the conductor is gold.

4. The process of claim 2 wherein the metal layers have approximately a one-to-one ratio of thickness to opening diameter.

5. The process of claim 2 wherein the step of bonding the metal layers includes:

(b5i) placing the metal layers in a fixture;

(b5ii) applying a pressure of between about 1,000 and 50,000 psi; and (b5iii) holding at a temperature of about 200–300° C.

6. The process of claim 1 wherein at least one of the plurality of intermediate metal sections has a plurality of openings with a first shape and another of the plurality of intermediate metal sections has a plurality of openings with a second shape.

7. The process of claim 1 wherein the insulation layer is parylene.

8. The process of claim 1 wherein the step of stacking the bottom plate and the top plate with the plurality of intermediate metal sections between the bottom plate and the top plate includes:

(c1) forming alignment holes in each of the bottom plate top plate, and plurality of intermediate metal sections;

(c2) aligning the alignment holes in each of the bottom plate, top plate, and plurality of intermediate metal sections so that the plurality of apertures in the top and bottom plates and the plurality of openings in the intermediate metal sections are aligned; and (c3) inserting pins into the alignment holes.

9. The process of claim 1 wherein the top plate and the bottom plate are formed of multiple thin metal layers.

10. The process of claim 1 wherein the apertures of the top plate and the apertures of the bottom plate are each coated with the insulation layer.

11. The process of claim 1 wherein the plurality of buckling beam wires each have an insulation coating.

12. A buckling beam probe assembly for electrically connecting a test apparatus with contact pads on the surface of a device to be tested, the assembly comprising:

a plurality of buckling beam wires each having a head, a body, and a tail and being pressed vertically onto the contact pads and buckling laterally to adapt to height differences of the contact pads caused by irregularities on the surface of the device to be tested;

a top plate having a first plurality of apertures receiving the heads of the plurality of buckling beam wires;

a bottom plate having a second plurality of apertures receiving the tails of the plurality of buckling beam wires; and a plurality of intermediate metal sections comprising multiple thin metal layers, said intermediate metal sections being positioned between the top plate and the bottom plate, a first one of said metal sections in contact with said top plate and a last one of said metal sections in contact with said bottom plate, each of said plurality of metal sections in contact with an adjacent metal section and each having a plurality of openings, said plurality of metal sections forming a continuous body between said top and said bottom plates and having a plurality of openings extending therethrough, the openings being coated with an insulation layer and receiving the bodies of the plurality of buckling beam wires.

13. The assembly of claim 12 wherein the insulation layer is one of parylene, polytetrafluoroethylene, and ceramic.

14. The assembly of claim 12 wherein the multiple thin metal layers are one of molybdenum, stainless steel, iron, nickel, iron-nickel alloys, and steel alloys.

15. The assembly of claim 14 wherein the metal layers are a steel alloy containing about 36% nickel.

16. The assembly of claim 12 wherein the metal layers are about 50 to 500 microns thick.

17. The assembly of claim 12 wherein at least one of the plurality of intermediate metal sections has a plurality of openings with a first shape and another of the plurality of intermediate metal sections has a plurality of openings with a second shape.

18. The assembly of claim 12 wherein the top plate and the bottom plate are formed of multiple thin metal layers.

19. The assembly of claim 12 wherein the apertures of the top plate and the apertures of the bottom plate are each coated with an insulation layer.

20. The assembly of claim 12 wherein the top plate, the bottom plate, and the plurality of intermediate metal sections each have corresponding alignment holes.

21. The assembly of claim 12 wherein the plurality of buckling beam wires each have an insulation coating.

22. The assembly of claim 12 wherein the plurality of buckling beam wires are loosely connected to the test apparatus.

23. A buckling beam probe assembly for electrically connecting a test apparatus with contact pads on the surface of a device to be tested, the assembly comprising:

a plurality of buckling beam wires each having a head loosely connected to the test apparatus, a body, and a tail connected to the contact pads and being pressed vertically onto the contact pads and buckling laterally to adapt to height differences of the contact pads caused by irregularities on the surface of the device to be tested;

a top plate being formed of multiple thin metal layers and having a first plurality of apertures, the first plurality of apertures receiving the heads of the plurality of buckling beam wires and being coated with an insulation layer;

a bottom plate being formed of multiple thin metal layers and having a second plurality of apertures, the second plurality of apertures receiving the tails of the plurality of buckling beam wires and being coated with the insulation layer; and a plurality of intermediate metal sections each being formed of multiple thin metal layers, the intermediate metal sections positioned between the top plate and the bottom plate connecting said top and said bottom metal plates each of said metal sections having a plurality of openings aligned with said apertures in said top and said bottom plates, the openings being coated with the insulation layer and receiving the bodies of the plurality of buckling beam wires.

24. The assembly of claim 23 wherein the insulation layer is parylene.

25. The assembly of claim 23 wherein the metal layers are a steel alloy containing about 36% nickel.

26. The assembly of claim 23 wherein at least one of the plurality of intermediate metal sections has a plurality of openings with a first shape and another of the plurality of intermediate metal sections has a plurality of openings with a second shape.

27. The assembly of claim 23 wherein the plurality of buckling beam wires each have an insulation coating.

28. The assembly of claim 23 wherein the top plate, the bottom plate, and the plurality of intermediate metal sections each have corresponding alignment holes.

29. A multi-contact probe assembly comprising a plurality of buckling beam wires in a plurality of openings arrayed in an electrically conductive supporting structure each of said buckling beam wires insulated from said electrically supporting structure and together with said supporting structure forming a co-axial transmission line wherein the electrically conductive supporting structure further comprises a top plate, a bottom plate, and a plurality of intermediate metal sections having said plurality of openings extending therethrough stacked between said top and said bottom plates each of said intermediate metal sections comprising multiple thin metal layers.

30. The multi-contact probe assembly according to claim 29 wherein each of said stacked plurality of metal plates also comprises a plurality of stacked and bonded metal layers.

31. The multi-contact probe assembly according to claim 30 wherein said metal layers comprise a plurality of etched openings and are coated with a conductor.

32. The multi-contact probe assembly according to claim 31 wherein said metal plates are each coated with an insulation layer.

* * * * *